US009619011B2

(12) United States Patent
Hyun

(10) Patent No.: US 9,619,011 B2
(45) Date of Patent: Apr. 11, 2017

(54) SYSTEM ON CHIP FOR DEBUGGING A CLUSTER REGARDLESS OF POWER STATE OF THE CLUSTER, METHOD OF OPERATING THE SAME, AND SYSTEM HAVING THE SAME

(71) Applicant: SAMSUNG ELECTRONICS CO., LTD., Suwon-si, Gyeonggi-do (KR)

(72) Inventor: Gyoung Hwan Hyun, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 223 days.

(21) Appl. No.: 14/339,786

(22) Filed: Jul. 24, 2014

(65) Prior Publication Data

US 2015/0052410 A1 Feb. 19, 2015

(30) Foreign Application Priority Data

Aug. 14, 2013 (KR) .................. 10-2013-0096376

(51) Int. Cl.
*G06F 1/32* (2006.01)
*G01R 31/3185* (2006.01)

(52) U.S. Cl.
CPC ... *G06F 1/3287* (2013.01); *G01R 31/318575* (2013.01)

(58) Field of Classification Search
CPC . G06F 1/3287; G06F 1/32; G01R 31/318575; G01R 31/3177; G01F 11/3656
USPC ........................ 713/300; 714/727, E11.155
See application file for complete search history.

(56) References Cited

U.S. PATENT DOCUMENTS

| 6,895,530 | B2 | 5/2005 | Moyer et al. |
| 7,536,597 | B2 | 5/2009 | McGowan |
| 8,255,730 | B2 | 8/2012 | Tatsumi |
| 2004/0148548 | A1* | 7/2004 | Moyer ............... G06F 11/3664 714/25 |
| 2007/0214389 | A1 | 9/2007 | Severson et al. |
| 2011/0283141 | A1* | 11/2011 | Lee ..................... G06F 11/22 714/30 |
| 2012/0110353 | A1* | 5/2012 | Ehrlich ............... G06F 1/3203 713/300 |
| 2012/0151264 | A1* | 6/2012 | Balkan ............... G06F 11/26 714/34 |
| 2012/0216089 | A1* | 8/2012 | Chen ................. G01R 31/3008 714/727 |

(Continued)

FOREIGN PATENT DOCUMENTS

| JP | 2006-003949 | 1/2006 |
| JP | 2006-146412 | 6/2006 |

(Continued)

*Primary Examiner* — Thomas Lee
*Assistant Examiner* — Aaron J Browne
(74) *Attorney, Agent, or Firm* — F. Chau & Associates, LLC

(57) ABSTRACT

A system on chip includes a debugging controller, a plurality of clusters, and a power management unit (PMU). The debugging controller is included in a first power domain and a joint test action group (JTAG) interface is included in the first power domain. Each of the clusters is included in at least second power domain different from the first power domain. The PMU is configured to release a powered-off state of the debugging controller in response to a debugging request signal output from the JTAG interface.

19 Claims, 11 Drawing Sheets

(56) References Cited

U.S. PATENT DOCUMENTS

2014/0013172 A1* 1/2014 Hopkins .......... G01R 31/31705
                                                        714/724

FOREIGN PATENT DOCUMENTS

| JP | 2008513853  | 5/2008 |
| JP | 2011-181757 | 9/2011 |
| JP | 2012-113593 | 6/2012 |

* cited by examiner

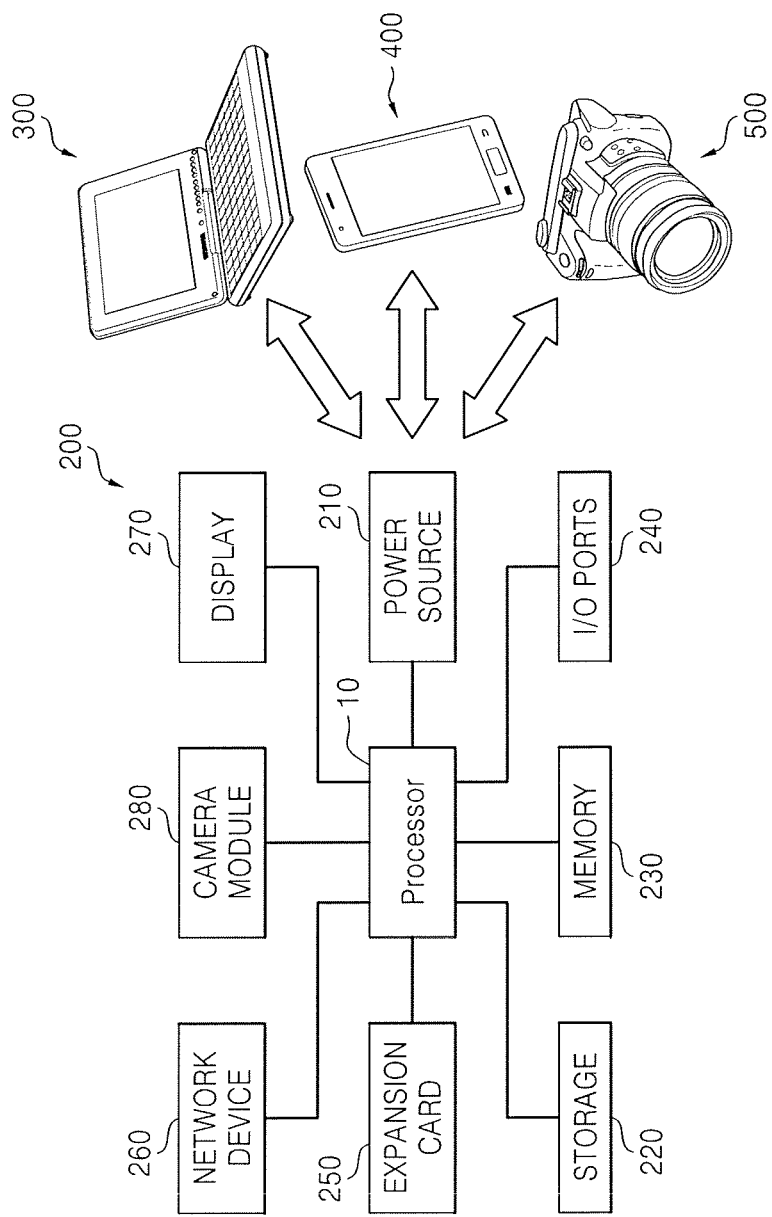

SYSTEM ON CHIP FOR DEBUGGING A CLUSTER REGARDLESS OF POWER STATE OF THE CLUSTER, METHOD OF OPERATING THE SAME, AND SYSTEM HAVING THE SAME

CROSS-REFERENCE TO RELATED PATENT APPLICATION

This application claims priority under 35 U.S.C. §119 to Korean Patent Application No. 10-2013-0096376 filed on Aug. 14, 2013 in the Korean Intellectual Property Office, the disclosure of which is incorporated by reference herein in its entirety.

TECHNICAL FIELD

The present inventive concept relates to a system on chip (SoC), and more particularly, to a system on chip (SoC) for debugging a cluster regardless of a power state of the cluster, a method of operating the same, and a system including the same.

DISCUSSION OF THE RELATED ART

In a system on chip (SoC) with a multi-cluster structure, each cluster may be powered off to reduce power consumption when each cluster does not operate normally.

Thus, when a debugging controller belongs to a power domain of a particular cluster and the cluster is powered off, the debugging controller might not perform the debugging operation on the particular cluster.

SUMMARY

According to an exemplary embodiment of the present inventive concept, a system on chip (SoC) is provided. The SoC includes a debugging controller, a plurality of clusters, and a power management unit (PMU). The debugging controller is included in a first power domain and a joint test action group (JTAG) interface is included in the first power domain. Each of the plurality of, clusters is included in at least second power domain different from the first power domain. The PMU is configured to release a powered-off state of the debugging controller in response to a debugging request signal output from the JTAG interface.

The PMU may be configured to continuously provide with power to the JTAG interface. The debugging controller may include the JTAG interface. The PMU may control power provided to each of the plurality of clusters. The PMU may release a powered-off state of a first cluster through the debugging controller when the first cluster corresponds to the debugging request signal. The debugging controller may be configured to debug the first cluster.

According to an exemplary embodiment of the present inventive concept, an application processor including the SoC may be provided.

According to an exemplary embodiment of the present inventive concept, a mobile electronic device including the SoC and a memory connected to the system on chip may be provided.

According to an exemplary embodiment of the present inventive concept, a method of operating a system on chip (SoC) is provided. The method includes performing powering-off, a power management unit (PMU), on a debugging controller in a first power domain, receiving, by the PMU, a debugging request signal output from a joint test action group (JTAG) interface in the first power domain, and releasing, by the PMU, the powered-off state of the debugging controller in response to the debugging request signal.

The PMU may continuously provide power to the JTAG interface. The PMU may control power provided to each of a plurality of clusters in the SoC. The method may further include releasing, by the PMU, a powered-off state of a first cluster in a second power domain through the debugging controller when the first cluster corresponds to the debugging request signal.

The method may further include performing debugging, by the debugging controller, on the first cluster.

According to an exemplary embodiment of the present inventive concept, a method of operating a system on chip (SoC) is provided. The method includes receiving, by a power management unit (PMU), a debugging request signal output from a joint test action group (JTAG) interface in a first power domain, and releasing, by the PMU, a powered-off state of a debugging controller in response to the debugging request signal. The PMU continuously provides power to the JTAG interface.

The method may further include generating, by the debugging controller, a control signal, transmitting, by the debugging controller, the control signal to the PMU, and releasing, by the PMU, a powered-off state of a first cluster corresponding to the debugging signal among a plurality of clusters in the SoC in response to the control signal.

The method further include transmitting, by the PMU, a first indication signal to the debugging controller when the first cluster is released from the powered-off state, and debugging, by the debugging controller, the first cluster in response to the first indication signal.

The method may further include transmitting, by the first cluster, a second indication signal to the debugging controller when the first cluster is released from the powered-off state and debugging, by the debugging controller, the first cluster in response to the second indication signal.

The method may further include generating, by the PMU, power state data of each of a plurality of clusters in the SoC, generating, by the debugging controller, a control signal based on the power state data, releasing, by the PMU, transmitting a powered-off state of a first cluster corresponding to the debugging signal among the plurality of clusters in response to the control signal, and debugging, by the debugging controller, the first cluster. The power state data may include information indicating whether each of the plurality of clusters is powered-off.

BRIEF DESCRIPTION OF THE DRAWINGS

Exemplary embodiments of the present inventive concept will be more clearly understood from the following detailed description taken in conjunction with the accompanying drawings in which:

FIG. 11 is a block diagram of an electronic system including an SOC according to an exemplary embodiment of the present inventive concept.

DETAILED DESCRIPTION OF THE EMBODIMENTS

Figure 1:
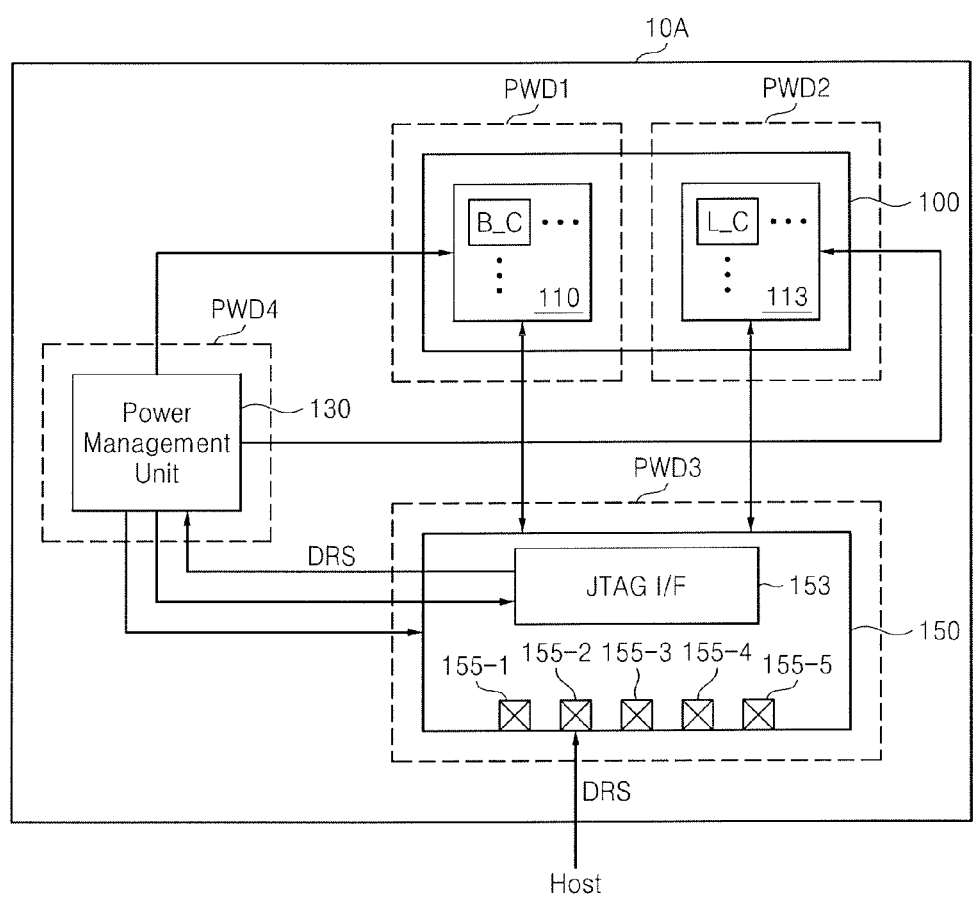
FIG. 1 is a block diagram of a system on chip (SoC) according to an exemplary embodiment of the present inventive concept.

Various exemplary embodiments of the present inventive concept will be described more fully hereinafter with reference to the accompanying drawings, in which the embodiments thereof are shown. The present inventive concepts may, however, be embodied in many different forms and should not be construed as being limited to the embodiments set forth herein. Rather, these exemplary embodiments are provided so that this disclosure will be thorough and complete, and will fully convey the scope of present inventive concept. In the drawings, the sizes and relative sizes of layers and areas may be exaggerated for clarity. Like numerals may refer to like elements throughout the specification and drawings.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concepts.

FIG. 1 is a block diagram of a system on chip (SoC) according to an exemplary embodiment of the present inventive concept. Referring to FIG. 1, an SoC 10A may be embodied as a printed circuit board (PCB) such as a mother board, an integrated circuit (IC), a processor, a multimedia processor, an integrated multimedia processor, or the like. Also, the SoC 10A may be an application processor.

The SoC 10A includes a multi-cluster 100, a power management unit (PMU) 130, and a debugging controller 150.

The multi-cluster 100 includes heterogeneous clusters, for example, a first cluster 110 and a second cluster 113. Although one multi-cluster 100 is shown in FIG. 1, the SoC 10A may include more than two multi-clusters. The present inventive concept is not restricted to the number of multi-clusters included in the SoC 10A.

The SoC 10A may include first through fourth power domains PWD1 through PWD4. For example, the first power domain PWD1 includes the first cluster 110, the second power domain PWD2 includes the second cluster 113, the third power domain PWD3 includes the debugging controller 150, and the fourth power domain PWD4 includes the PMU 130.

The debugging controller 150 is included by the power domain PWD3 different from each of the power domains PWD1 and PWD2 including the clusters 110 and 113, respectively. For example, since the debugging controller 150 does not belong to the same power domain(s) (e.g., first power domain PWD1 and/or second power domain PWD2) as the clusters 110 and/or 113, the debugging controller 150 may independently operate regardless power state (e.g., powered-off state) of the clusters 110 and/or 113.

According to an exemplary embodiment of the present inventive concept, the first through fourth power domains PWD1 through PWD4 may be defined by a function and/or a power control method of each component 110, 113, 130, and 150.

The first cluster 110 may include big cores B_C, and the second cluster 113 may include little cores L_C. The big cores B_C may form the first cluster 110 as a processing cluster, and the little cores L_C may form the second cluster 113 as a processing cluster.

An operation frequency of each of the cores B_C and L_C which are independent from each other may be different from each other. For example, the operation frequency of the big core B_C may be higher than the operation frequency of the little core L_C. Accordingly, the first cluster 110 may use a relatively wide pipeline and may have relatively high performance, and the second cluster 113 may use a relatively narrow pipeline and may have relatively low performance to use less power.

The PMU 130 controls power-gating with respect to each of the components 110, 113, and 153. For example, the PMU 130 controls power-gating with respect to the debugging controller 150 and controls power-gating of each of the clusters 110 and 113. Here, the power-gating controls power provided to a certain circuit or a device by using, for example, a power-transistor performing powering on (or turning on) or powering off (or turning off).

According to an exemplary embodiment of the present inventive concept, the PMU 130 may release a powered-off state of the debugging controller 150 in response to a debugging request signal DRS output from the joint test action group (JTAG) interface 153.

For example, the PMU 130 may maintain the powered-off state of the debugging controller 150 before receiving the debugging request signal DRS. Accordingly, the power consumption in the debugging controller 150 may be reduced or blocked since the debugging controller 150 may maintain the powered-off state until the PMU 130 receives a debugging request signal DRS.

The PMU 130 may continuously provide power to the JTAG interface 153 and thus, the JTAG interface 153 may transmit a debugging request signal DRS received from a host to the PMU 130.

According to an exemplary embodiment of the present inventive concept, the PMU 130 releases a powered-off state of either the cluster 110 or the cluster 113 corresponding to the debugging request signal DRS under the control of the powered-off released from debugging controller 150, when the cluster 110 or 113 corresponding to the debugging request signal DRS among the clusters 110 and 113 is in the powered-off state. For example, the PMU provides power to the corresponding cluster 110 or 113. The debugging controller 150 includes a plurality of pins 155-1 through 155-5 and the JTAG interface 153.

FIG. 1 illustrates that the JTAG interface 153 is illustrated as being embodied inside the debugging controller 150, the JTAG interface 153 according to an exemplary embodiment of the present inventive concept may be embodied in the outside of the debugging controller 150.

A test data in (TDI) signal may be input to the debugging controller 150 through the TDI pin 155-1. A test clock (TCK) signal may be input to the debugging controller 150 through the TCK pin 155-2. A test reset (TRST) signal may be input to the debugging controller 150 through the TRST pin 155-3. A test mode select (TMS) signal may be input to the debugging controller 150 through the TRST pin 155-3. A test data out signal (TDO) processed in the debugging controller 150 may be output from the debugging controller 150 to the host through the TDO pin 155-1.

According to an embodiment of the present inventive concept, the TRST pin 155-3 might not be provided. FIG. 1 illustrates the plurality of pins 155-1 through 155-5 are embodied inside the debugging controller 150, the plurality of pins 155-1 through 155-5 according to an exemplary embodiment of the present inventive concept may be embodied in the outside of the debugging controller 150.

The debugging controller 150 communicates with the host, the PMU 130, and the clusters 110 and 113 through the JTAG interface 153.

The JTAG interface 153 may receive the debugging request signal DRS output from the host through the TDI pin 155-1. According to an exemplary embodiment of the present inventive concept, the debugging request signal DRS may be the TCK signal.

The JTAG interface 153 may transmit the received debugging request signal DRS or a signal related to the debugging request signal DRS to the PMU 130. The powered-off state of the debugging controller 150 may be released under the control of the PMU 130.

As described above, although the debugging controller 150 maintains the power-off state under the control of the PMU 130 until the PMU 130 receives the debugging request signal DRS, the JTAG interface 153 transmits the debugging request signal DRS received from the host to the PMU 130 because the JTAG interface 153 is being provided with power under the control of the PMU 130.

The debugging controller 150 that is released from the powered-off state (hereinafter, referred to as a "powered-on debugging controller 150" or "a debugging controller 150 provided with power") debugs one or more clusters 110 and/or 113. For example, the powered-on debugging controller 150 may debug one or more clusters 110 and/or 113 corresponding to the debugging request signal DRS.

According to an exemplary embodiment of the present inventive concept, the powered-on debugging controller 150 controls the PMU 130 and the PMU 130 may release the powered-off state of the cluster 110 or 113 corresponding to the debugging request signal DRS among the clusters 110 and 113, when the cluster(s) 110 and/or 113 corresponding to the debugging request signal DRS is in the powered-off state.

Since the debugging controller 150 is not included in the power domains PWD1 and PWD2 of the clusters 110 and 113, the debugging controller 150 performs debugging on the cluster 110 or 113 corresponding to the debugging request signal DRS automatically regardless of the power state of the clusters 110 and 113.

Figure 2:
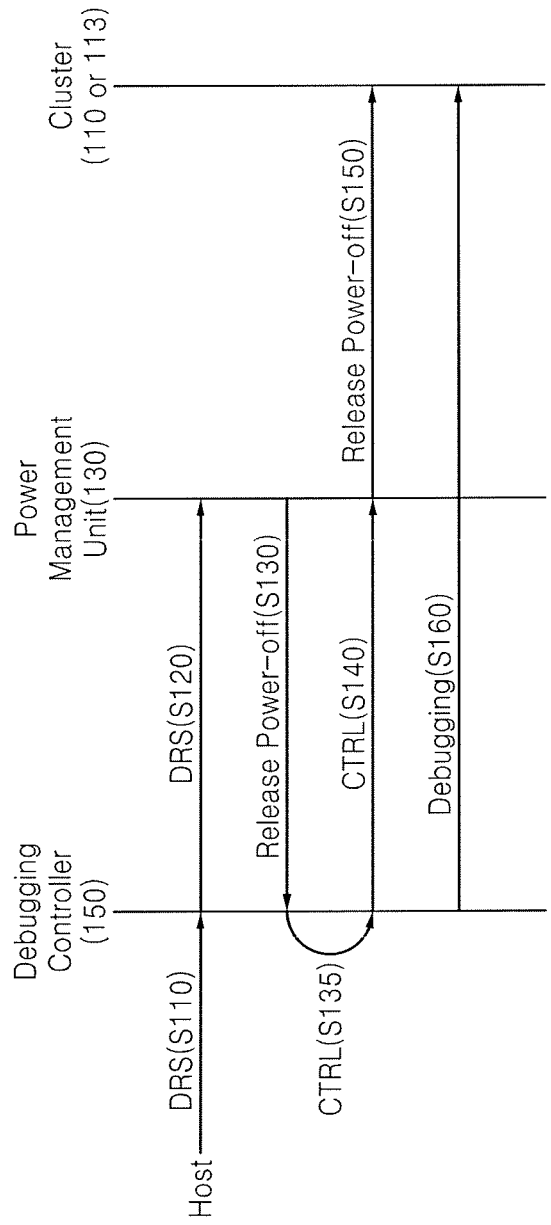
FIG. 2 is a flow chart illustrating an operation of an SoC according to an exemplary embodiment of the present inventive concept.

FIG. 2 is a view illustrating an operation of an SoC according to an exemplary embodiment of the present inventive concept. Referring to FIGS. 1 and 2, the JTAG interface 153 receives a debugging request signal DRS output from the host at step S110. The JTAG interface 153 transmits the debugging request signal DRS to the PMU 130 at step S120. The JTAG interface 153 is continuously provided with power under the control of the PMU 130.

The PMU 130 releases the powered-off state of the debugging controller 150 in response to the debugging request signal DRS at step S130. For example, the PMU 130 maintains the powered-off state of the debugging controller 150 except for the JTAG interface 153 until the PMU 130 receives the debugging request signal DRS from the JTAG interface 153.

The powered-on debugging controller 150 generates a control signal CTRL at step S135. For example, the control signal CTRL is a signal for releasing the powered-off state of the cluster 110 or 113 corresponding to the debugging request signal DRS.

The powered-on debugging controller 150 transmits the control signal CTRL to the PMU 130 at step S140.

The PMU 130 may release the powered-off state of the cluster 110 or 130 corresponding to the debugging request signal DRS among the clusters 110 and 130 in response to the debugging request signal DRS at step S150. The powered-on debugging controller 150 performs debugging on the powered-on cluster 110 and/or 130 at step S160.

Figure 3:
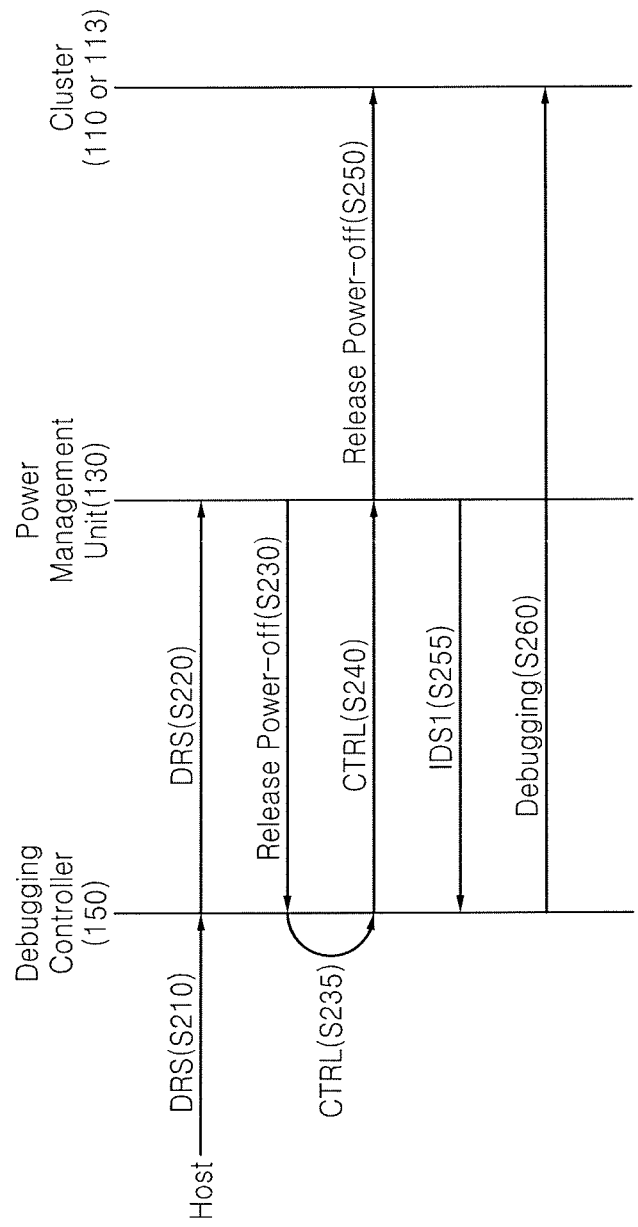
FIG. 3 is a flow chart illustrating an operation of an SoC according to an exemplary embodiment of the present inventive concept.

FIG. 3 is a view illustrating an operation of an SoC according to an exemplary embodiment of the present inventive concept.

Referring to FIGS. 1 and 3, the JTAG interface 153 receives a debugging request signal DRS output from the host at step S210. The JTAG interface 153 transmits the debugging request signal DRS to the PMU 130 at step S220. The JTAG interface 153 is continuously provided with power under the control of the PMU 130.

The PMU 130 releases the powered-off state of the debugging controller 150 in response to the debugging request signal DRS at step S230. For example, the PMU 130 maintains the powered-off state of the debugging controller 150 except for the JTAG interface 153 until the PMU 130 receives the debugging request signal DRS from the JTAG interface 153.

The powered-on debugging controller 150 generates a control signal CTRL at step S235. For example, the PMU 130 provides the cluster 110 and/or 113 corresponding to the debugging request signal DRS with power in response to the control signal CTRL output from the debugging controller 150.

The powered-on debugging controller 150 transmits the control signal CTRL to the PMU 130 at step S240.

The PMU 130 releases the powered-off state of the cluster 110 or 130 corresponding to the debugging request signal DRS among the clusters 110 and 130 in response to the control signal CTRL at step S250. The PMU 130 transmits a first indication signal IDS1 to the powered-on debugging controller 150 at step S255. For example, the first indication signal IDS1 indicates that the cluster 110 or 130 corresponding to the debugging request signal DRS is released from the powered-off state.

The powered-on debugging controller 150 may debug the powered-on cluster 110 or 130 in response to the first indication signal IDS1 at step S260.

Figure 4:
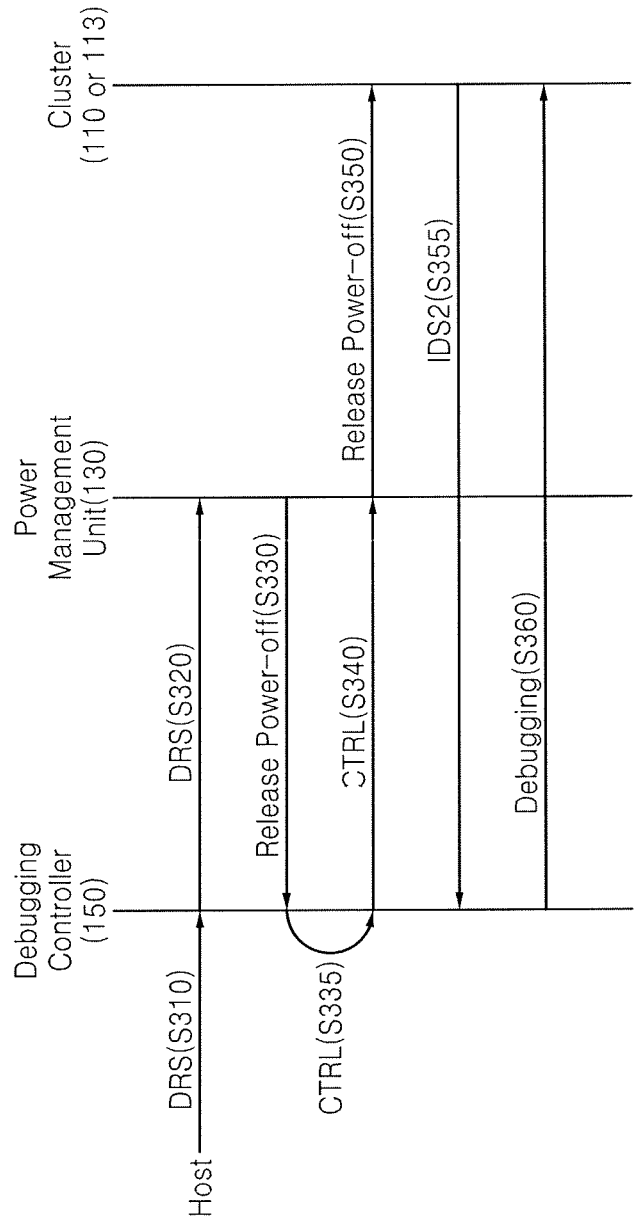
FIG. 4 is a flow chart illustrating an operation of an SoC according to an exemplary embodiment of the present inventive concept.

FIG. 4 is a view illustrating an operation of an SoC according to an exemplary embodiment of the present inventive concept. Referring to FIGS. 1 and 4, the JTAG interface 153 receives a debugging request signal DRS output from the host at step S310. The JTAG interface 153 transmits the debugging request signal DRS to the PMU 130 at step S320. The JTAG interface 153 is continuously provided with power under the control of the PMU 130.

The PMU 130 releases the powered-off state of the debugging controller 150 in response to the debugging request signal DRS at step S330. For example, the PMU 130 maintains the powered-off state of the debugging controller 150 except for the JTAG interface 153 until the PMU 130 receives the debugging request signal DRS from the JTAG interface 153.

The powered-on debugging controller 150 generates a control signal CTRL at step S335. The power-on debugging controller 150 transmits the control signal CTRL to the PMU 130 at step S340. The PMU 130 releases the powered-off state of the cluster 110 or 130 corresponding to the debugging request signal DRS among the clusters 110 and 130 in response to the control signal CTRL at step S350.

The powered-on cluster 110 or 130 transmits a second indication signal IDS2 to the powered-on debugging controller 150 at step S355. For example, the second indication signal IDS2 indicates that the cluster 110 or 130 is powered on.

The powered-on debugging controller 150 may debug the powered-on cluster 110 or 130 in response to the second indication signal IDS2 at step S360.

Figure 5:
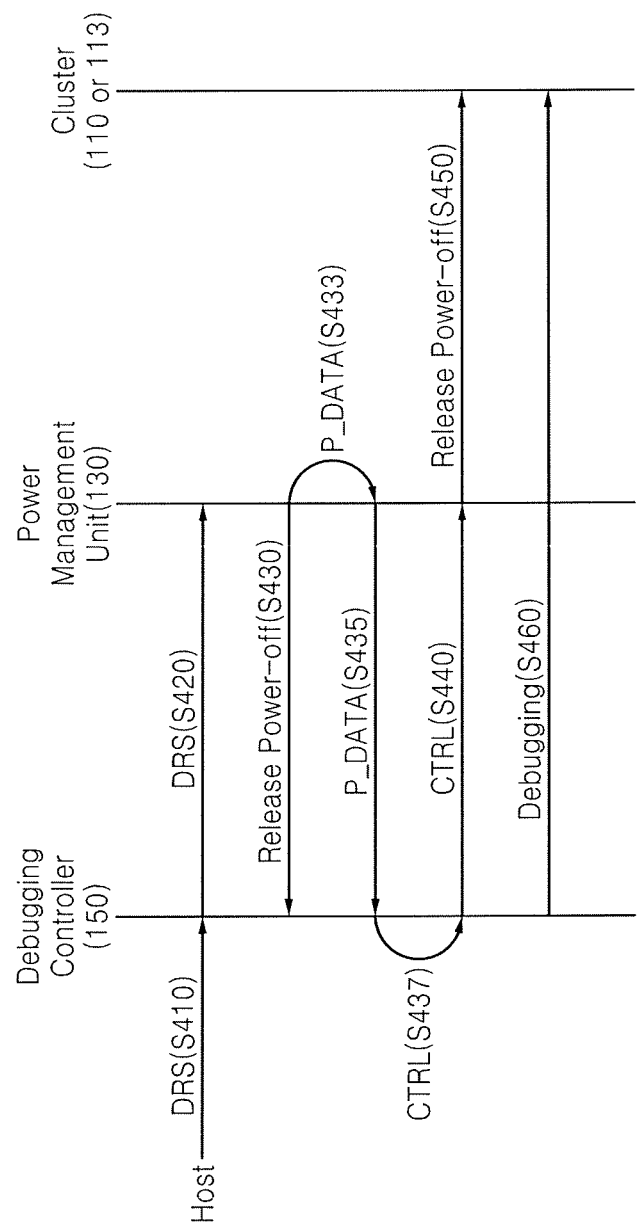
FIG. 5 is a flow chart illustrating an operation of an SoC according to an exemplary embodiment of the present inventive concept.

FIG. 5 is a view illustrating an operation of an SoC according to an exemplary embodiment of the present inventive concept. Referring to FIGS. 1 and 5, the JTAG interface 153 receives a debugging request signal DRS output from the host at step S410. The JTAG interface 153 transmits the debugging request signal DRS to the PMU 130 at step S420. The JTAG interface 153 maintains continuously the powered-on state under the control of the PMU 130.

The PMU 130 releases the powered-off state of the debugging controller 150 in response to the debugging request signal DRS at step S430. For example, the PMU 130 maintains the powered-off state of the debugging controller 150 except for the JTAG interface 153 until the PMU 130 receives the debugging request signal DRS from the JTAG interface 153.

The PMU 130 checks the power state of the clusters 110 and 130 and generates power state data P_DATA according to a result of checking at step S433. For example, the power state data P_DATA includes data regarding whether each of the clusters 110 and 130 is released from the powered-off state (e.g., powered-on) or not.

The PMU 130 transmits the power state data P_DATA to the powered-on debugging controller 150 at step S435. The powered-on debugging controller 150 generates a control signal. CTRL based on the power state data P_DATA at step S437.

For example, the powered-on debugging controller 150 confirms the powered-off state of the cluster 110 or 113 corresponding to the debugging request signal DRS based on the power state data P_DATA and generates the control signal CTRL at step S437. The powered-on debugging controller 150 transmits the control signal CTRL to the PMU 130 at step S440.

The PMU 130 releases the powered-off state of the cluster 110 or 130 corresponding to the debugging request signal DRS among the clusters 110 and 130 in response to the control signal CTRL at step S450. The powered-on debugging controller 150 may debug the powered-on clusters 110 or 130 at step S460.

The SoC 10A may perform the step S460 directly without performing the steps S437, S440, and S450 when, based on the power state data P_DATA, the powered-on debugging controller 150 determines that the cluster 110 or 113 is released from the powered-off state.

Figure 6:
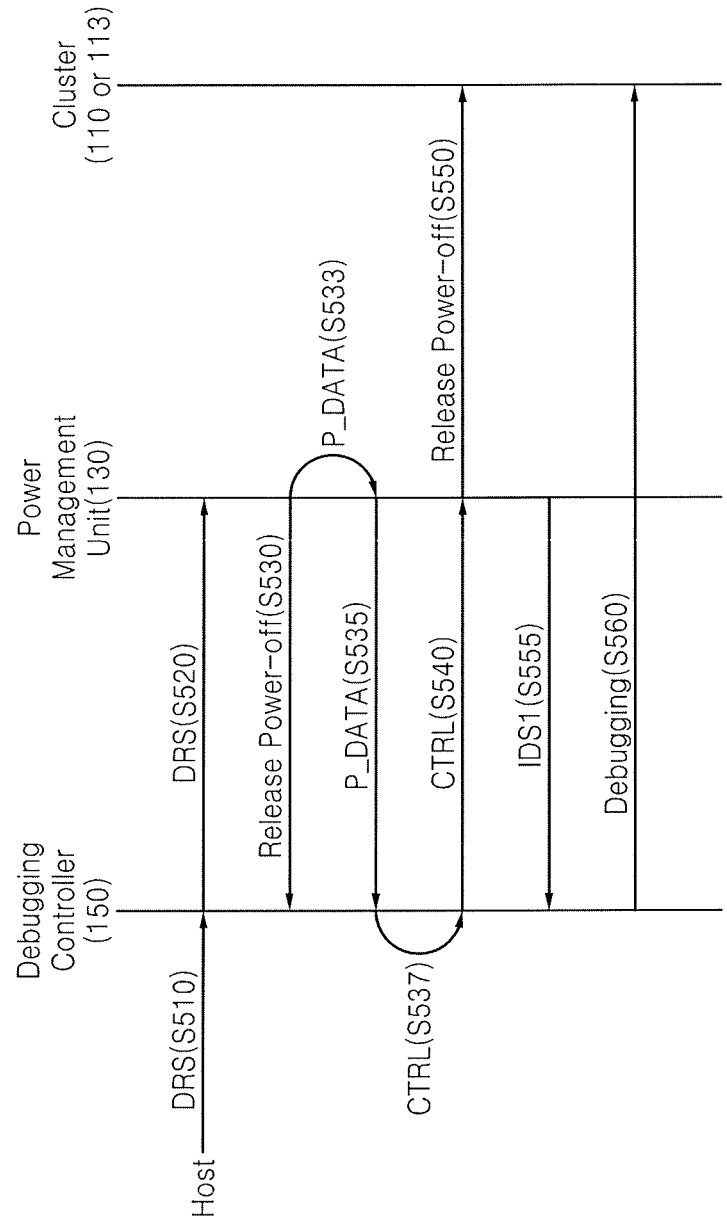
FIG. 6 is a flow chart illustrating an operation of an SoC according to an exemplary embodiment of the present inventive concept.

FIG. 6 is a view illustrating an operation of an SoC according to an exemplary embodiment of the present inventive concept. Referring to FIGS. 1 and 6, the JTAG interface 153 receives a debugging request signal DRS output from the host at step S510. The JTAG interface 153 transmits the debugging request signal DRS to the PMU 130 at step S520. The JTAG interface 153 is continuously provided with power under the control of the PMU 130.

The PMU 130 releases the powered-off state of the debugging controller 150 in response to the debugging request signal DRS at step S530. For example, the PMU 130 maintains the powered-off state of the debugging controller 150 except for the JTAG interface 153 until the PMU 130 receives the debugging request signal DRS from the JTAG interface 153.

The PMU 130 checks the power state of the cluster 110 or 130 corresponding to the debugging request signal DRS among the clusters 110 and 130 and generates power state data P_DATA based on a result of checking at step S533. For example, the power state data P_DATA may include data with respect to whether each of the clusters 110 and 130 is released from the powered-off state or not.

The PMU 130 may transmit the power state data P_DATA to the powered-on debugging controller 150 at step S535. The powered-on debugging controller 150 may generate a control signal CTRL based on the power state data P_DATA at step S537.

For example, the powered-on debugging controller 150 may confirm the powered-off state of the cluster 110 or 113 corresponding to the debugging request signal DRS based on the power state data P_DATA and generate the control signal CTRL at step S537. The powered-on debugging controller 150 may transmit the control signal CTRL to the PMU 130 at step S540.

The PMU 130 may release the powered-off state of the cluster 110 or 130 corresponding to the debugging request signal DRS among the clusters 110 and 130 in response to the control signal CTRL at step S550. The PMU 130 may transmit a first indication signal IDS1 to the powered-on debugging controller 150 at step S555. For example, the first indication signal IDS1 indicates that the cluster 110 or 130 is released from the powered-off state.

The power-off released debugging controller 150 may debug the powered-on cluster 110 or 130 in response to the first indication signal IDS1 at step S560.

The SoC 10A may perform the step S560 directly without performing the steps S537, S540, S550, and S555 when, based on the power state data P_DATA, the powered-on debugging controller 150 determines that the cluster 110 or 113 is released from the powered-off state.

Figure 7:
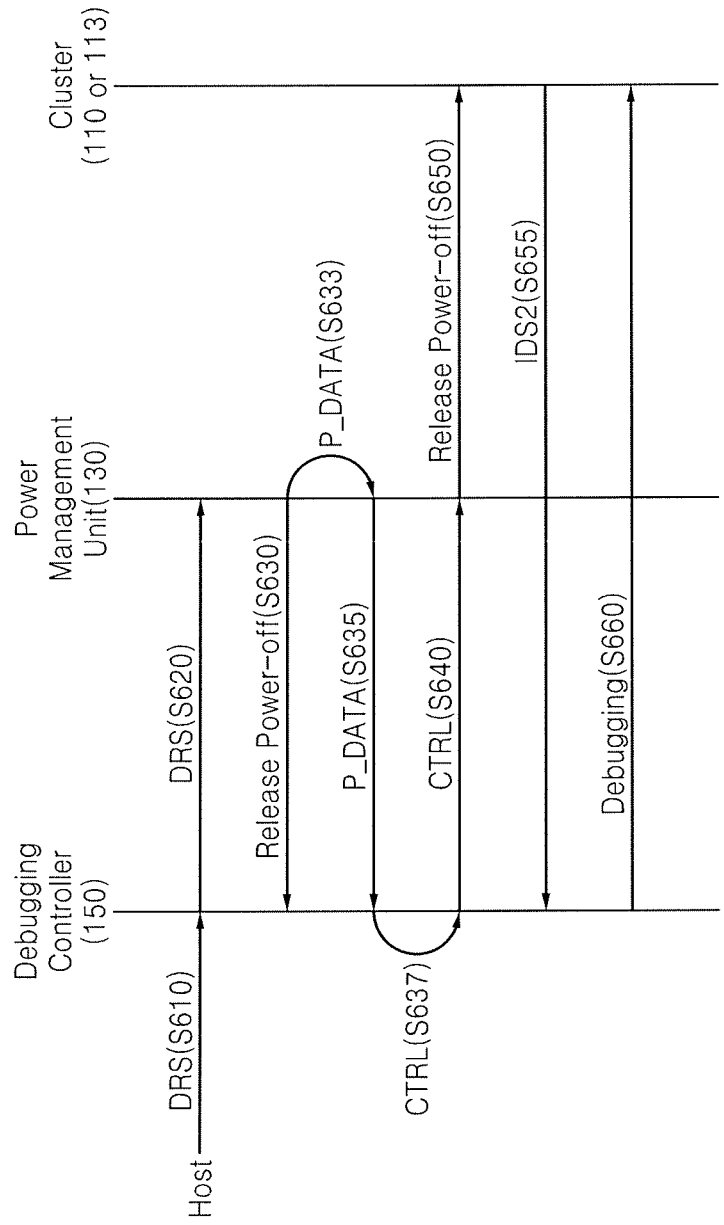
FIG. 7 is a flow chart illustrating an operation of an SoC according to an exemplary embodiment of the present inventive concept.

FIG. 7 is a view illustrating an operation of an SoC according to an exemplary embodiment of the present inventive concept. Referring to FIGS. 1 and 7, the JTAG interface 153 receives a debugging request signal DRS output from the host at step S610. The JTAG interface 153 transmits the debugging request signal DRS to the PMU 130 at step S620. The JTAG interface 153 is continuously provided with power under the control of the PMU 130.

The PMU 130 releases the powered-off state of the debugging controller 150 in response to the debugging control signal DRS at step S630. For example, the PMU 130 maintains the powered-off state of the debugging controller 150 except for the JTAG interface 153 until the PMU 130 receives the debugging request signal DRS from the JTAG interface 153.

The PMU 130 checks the power state of the cluster 110 or 130 corresponding to the debugging request signal DRS among the clusters 110 and 130 and generates the power state data P_DATA according to a result of checking at step S633. For example, the power state data P_DATA may include data regarding whether each of the clusters 110 and 130 is released from the powered-off state or not.

The PMU 130 transmits the power state data P_DATA to the powered-on debugging controller 150 at step S635. The powered-on debugging controller 150 generates a control signal CTRL based on the power state data P_DATA at step S637.

For example, the powered-on debugging controller 150 confirms the powered-off state of the cluster 110 or 113 corresponding to the debugging request signal DRS based on the power state data P_DATA and generates the control signal CTRL at step S637. The powered-on debugging controller 150 transmits the control signal CTRL to the PMU 130 at step S640.

The PMU 130 releases the powered-off state of the cluster 110 or 130 corresponding to the debugging request signal DRS among the clusters 110 and 130 in response to the control signal CTRL at step S650.

The powered-on cluster 110 or 130 transmits a second indication signal IDS2 to the powered-on debugging controller 150 at step S655. For example, the second indication signal IDS2 indicates that the cluster 110 or 130 is released from the powered-off state. For example, the second indication signal IDS2 may be a result of detecting power provided to the powered-on cluster 110 or 130.

The powered-on debugging controller 150 may debug the powered-on cluster 110 or 130 in response to the second indication signal IDS2 at step S660.

The SoC 10A performs the step S660 without performing the steps S637, S640, S650, and S655 when, based on the power state data P_DATA, the powered-on debugging controller 150 determines that the cluster 110 or 113 is released from the powered-off state.

Figure 8:
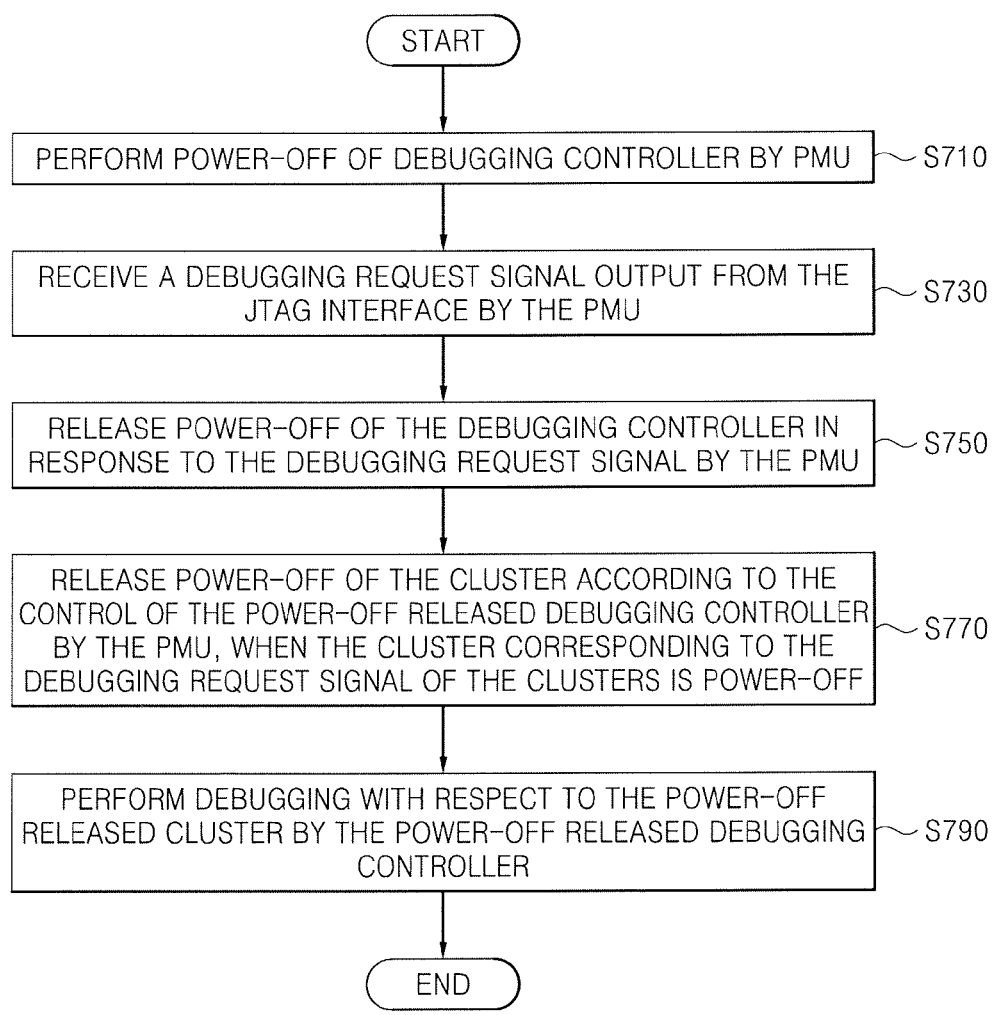
FIG. 8 is a flow chart illustrating a method of operating an SoC according to an exemplary embodiment of the present inventive concept.

FIG. 8 is a flow chart illustrating a method of operating the SoC according to an exemplary embodiment of the present inventive concept. Referring to FIGS. 1 through 8, the PMU 130 may perform powering-off on the debugging controller 150 at step S710.

The PMU 130 receives a debugging request signal DRS output from the JTAG interface 153 at step S730 and releases the powered-off state of the debugging controller 150 in response to the debugging request signal DRS at step S750.

The PMU 130 releases the powered-off state of the cluster 110 or 113 under the control of the powered-on debugging controller 150 when the cluster 110 or 113 corresponding to the debugging request signal DRS among the clusters 110 and 113 is powered-off. The powered-on debugging controller 150 may debug the powered-on cluster 110 or 113 at step S790.

Figure 9:
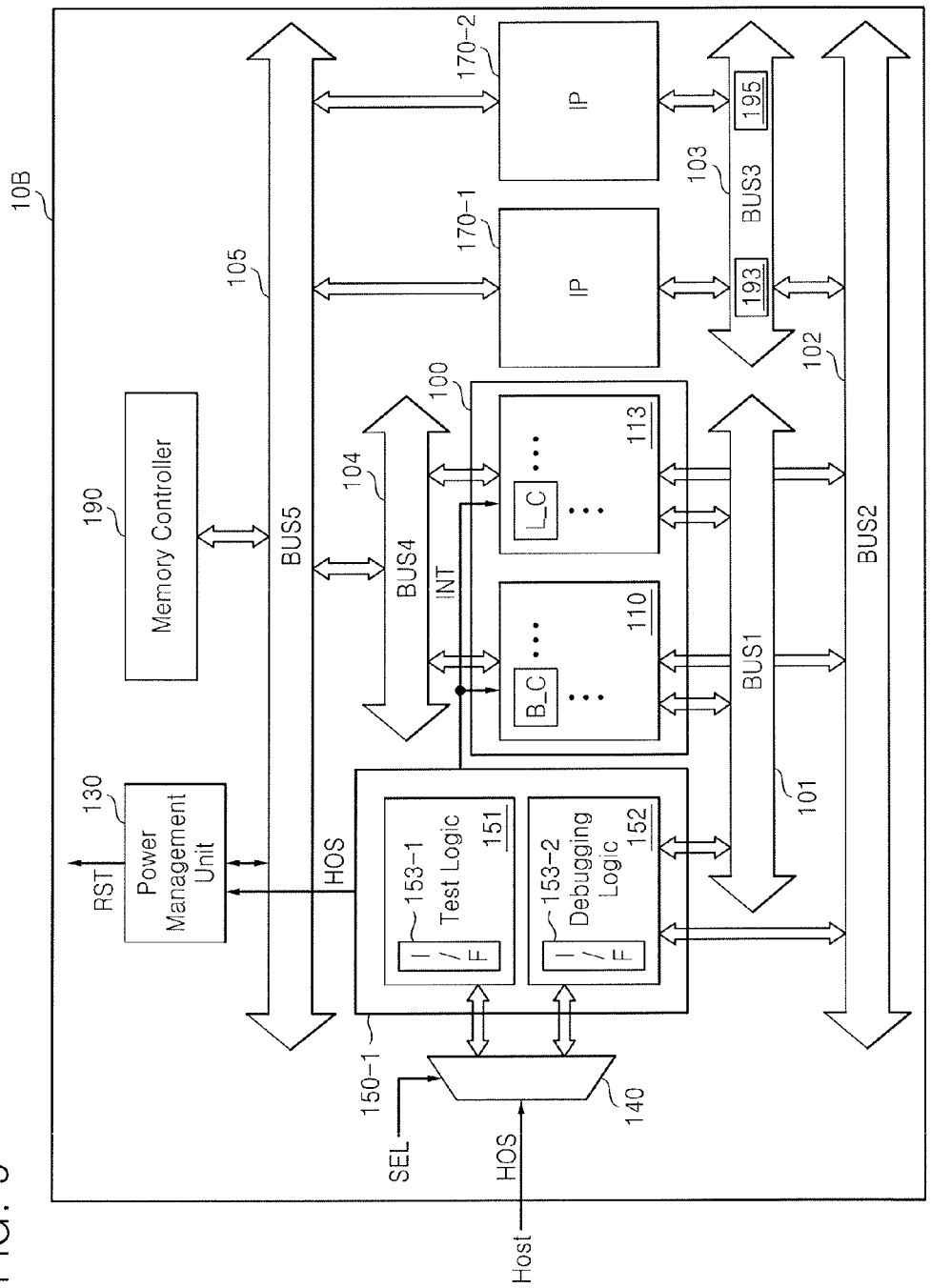
FIG. 9 is a block diagram of an SoC according to an exemplary embodiment of the present inventive concept.

FIG. 9 is a block diagram of an SoC according to an exemplary embodiment of the present inventive concept. Referring to FIG. 9, the SoC 10B may be embodied as a printed circuit board (PCB) such as a motherboard, an integrated circuit (IC), a processor, a multimedia processor, an integrated multimedia processor, or the like. In addition, the SoC 10B may be an application processor.

The SoC 10B includes a multi-cluster 100, a plurality of buses 101 through 105, a PMU 130, a signal distribution circuit 140, a debugging controller 150-1, intellectual properties (IPs) 170-1 and 170-2, and a memory controller 190.

The operation of the multi-cluster 100, the PMU 130, and the debugging controller 150-1 of the SoC 10B shown in FIG. 9 may be substantially identical to the operation of the multi-cluster 100, the PMU 130, and the debugging controller 150 of the SoC 10A shown in FIG. 1.

Each of the components 110, 130, 150-1, 170-1, 170-2, and 190 communicates (or transmits or receives data) with each other through the plurality of buses 101 through 105.

A first bus 101 is a debug bus, a second bus 102 and a third bus 103 are control buses, and a fourth bus 104 and a fifth bus 105 are data buses.

For example, the second bus 102 may be a main control bus, and the third bus 103 may be a sub-control bus. The fourth bus 104 may be a sub-data bus, and the fifth bus 105 may be a main data bus.

The multi-cluster 100 includes heterogeneous clusters, for example, a first cluster 110 and a second cluster 113. Although one multi-cluster 100 is shown in FIG. 9, the SoC 10B may include more than two clusters. The present inventive concept is not restricted to the number of multi-clusters included in the SoC 10B.

The first cluster 110 may include big cores B_C, and the second cluster 113 may include little cores L_C.

The cluster 110 or 113 assigns one or more IPs 170-1 and/or 170-2 for transaction(s) through the buses 101 through 103.

The one or more IPs 170-1 and/or 170-2 processes the assigned transaction(s).

The IP denotes a function block used in the SoC 10B. For example, the function block may be a graphic processing unit (GPU), a memory, a universal serial bus (USB), a peripheral component interconnect (PCI), a digital signal processor (DSP), a wired interface, a wireless interface, a controller, an embedded software, a codec, a video module (for example, camera interface), a Joint Photographic Experts Group (JPEG) processor, a video processor, a mixer, an audio system, or a driver.

A host may transmit a hang occurrence signal (HOS) to the SoC 10B when at least one of the IP 170-1 and/or 170-2 performs a series of operation to process the transaction(s) assigned through buses 101 through 103 and a bus hang occurs in the SoC 10B.

The signal distribution circuit 140 transmits the hang occurrence signal (HOS) output from the host to a test logic 151 or to a debugging logic 152 according to a level of a selection signal (SEL). For example, the signal distribution circuit 140 may be embodied as a demultiplexer. The selection signal (SEL) may be generated from the host.

According to an exemplary embodiment of the present inventive concept, the selection signal (SEL) may be generated from a signal generation circuit (not shown) that may be included in the SoC 10B. For example, the signal distribution circuit 140 transmits the hang occurrence signal (HOS) to the test logic 151 when the selection signal (SEL) has a first level (for example, data 0 or a relatively low level).

The signal distribution circuit 140 transmits the hang occurrence signal (HOS) to the debugging logic 152 when the selection signal (SEL) has a second level (for example, data 1 or a relatively high level).

The debugging controller 150-1 transmits the hang occurrence signal (HOS) output from the signal distribution circuit 140 to the PMU 130.

In addition, the debugging controller 150-1 generates an interrupt signal (INT) in response to the hang occurrence signal (HOS) and transmits the interrupt signal (INT) to the cluster 110 and/or 113 which assigns transaction(s) to at least one IP 170-1 and/or 170-2 generating a bus hang.

In addition, the cluster 110 and/or 113 cancels the transaction(s) in response to the interrupt signal (INT) and recognizes (or determines) the information of the transaction(s). Thus, the cluster 110 and/or 113 might not transmit the signal (or data) related to the transaction(s) to the at least one IP 170-1 and/or 170-2 generating a bus hang. The debugging controller 150-1 includes the test logic 151 and the debugging logic 152.

The test logic 151 transmits the hang occurrence signal (HOS) output from the signal distribution circuit 140 to the PMU 130 through a first JTAG interface 153-1 when the selection signal (SEL) has the first level. The test logic 151 generates an interrupt signal (INT) in response to the hang occurrence signal (HOS) and transmits the generated interrupt signal (INT) to the cluster 110 or 113 which assigns transaction(s) to at least one IP 170-1 and/or 170-2.

The debugging logic 152 transmits the hang occurrence signal (HOS) output from the signal distribution circuit 140 to the PMU 130 through a second JTAG interface 153-2 when the selection signal (SEL) has the second level. The debugging logic 152 generates an interrupt signal (INT) in response to the hang occurrence signal (HOS) and transmits the generated interrupt signal (INT) to the cluster 110 or 113 which assigns transaction(s) to at least one IP 170-1 and/or 170-2.

FIG. 9 illustrates that each of the JTAG interfaces 15-1 and 153-2 is included in each of the corresponding logics 151 and 152 to be embodied as each different interface, according to an exemplary embodiment of the present inventive concept, the JTAG interfaces 153-1 and 153-2 may be embodied into one JTAG interface.

The PMU 130 generates a reset signal (RST) to reset a control bus 103 corresponding to at least one of the IPs 170-1 and/or 170-2 generating a bus hang in the SoC 10B under the control of debugging controller 150-1.

For example, the PMU 130 generates a reset signal (RST) to reset a control bus 103 corresponding to at least one of the IPs 170-1 and/or 170-2 generating a bus hang in response to the hang occurrence signal (HOS) output from the first JTAG interface 153-1 or the second JTAG interface 153-2.

The PMU 130 transmits the reset signal (RST) to the control bus 103 corresponding to at least one of the IPs 170-1 and/or 170-2 generating a bus hang.

The control bus 103 resets the bus hang in response to the reset signal (RST). The control bus 103 includes block logics 193 and 195.

Each of the block logics 193 and 195 corresponds to the IPs 170-1 and 170-2, respectively.

In response to the reset signal (RST), each of the block logics 193 and 195 blocks signal (or data) input to the IP 170-1 or 170-2 generating a bus hang or input of a signal (or data) output from the IP 170-1 or 170-2.

In response to the reset signal (RST), at least one of the block logics 193 and/or 195 blocks (or separates) at least one of the IPs 170-1 and/or 170-2 generating a bus hang from the reset control bus 103.

The IP 170-1 and/or 170-2 that does not pertain to the bus hang transmits/receives signals (or data) to/from the clusters 110 and 113 through the reset control bus 103. The multi-cluster 100 transmits/receives data to/from an external memory (not shown) through the memory controller 190.

Figure 10:
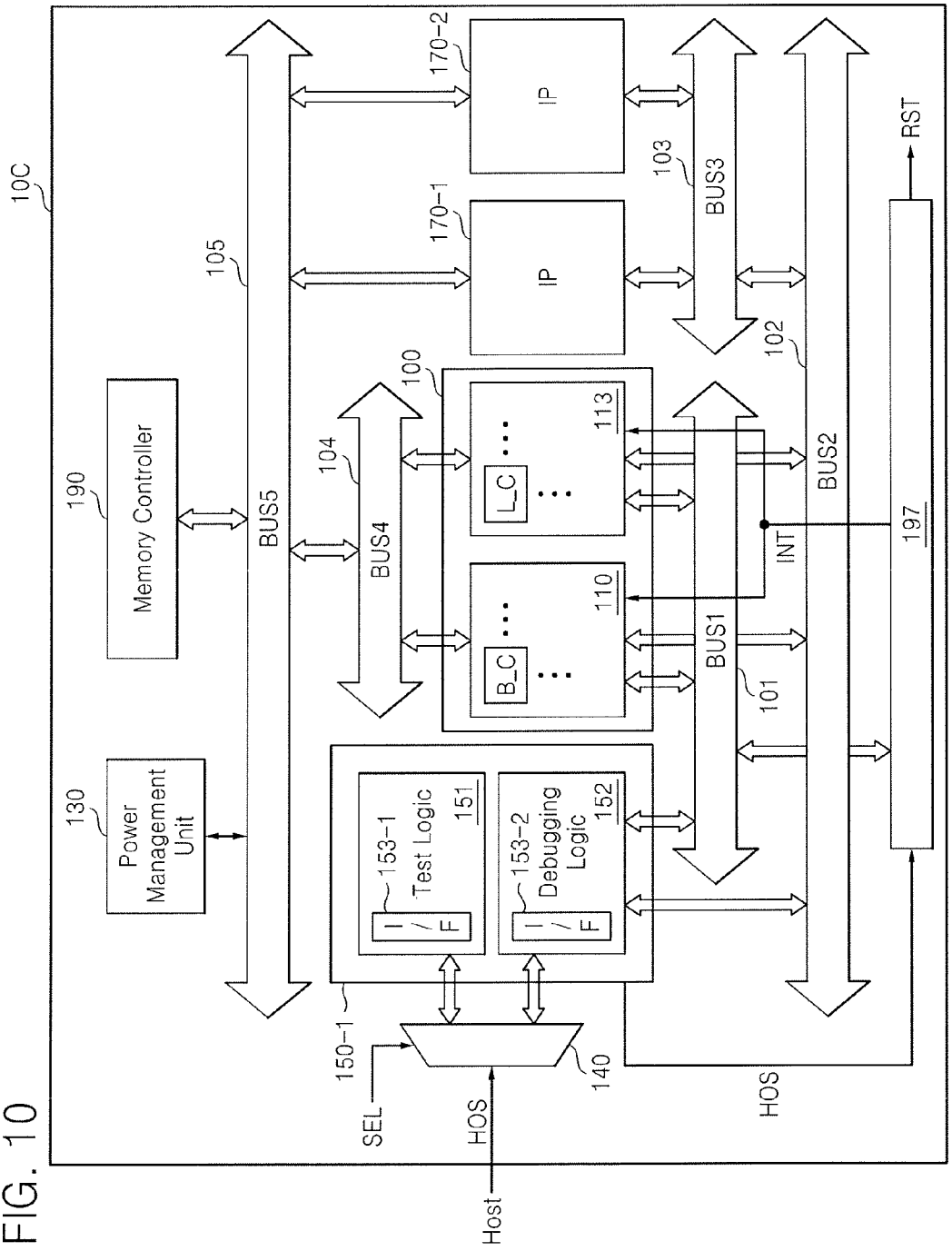
FIG. 10 is a block diagram of an SoC according to an exemplary embodiment of the present inventive concept.

FIG. 10 is a block diagram of an SoC according to an exemplary embodiment of the present inventive concept. Referring to FIG. 10, the SoC 10C includes a multi-cluster 100, a plurality of buses 101 through 105, a signal distribution circuit 140, a debugging controller 150-1, IPs 170-1 and 170-2, a memory controller 190, and a monitoring module 197.

A module in the specification may denote a hardware for performing a function and an operation of each name explained in the specification, a computer program code for performing a certain function and a certain operation, or an electronic recording media loading a computer program code for performing a certain function and a certain operation, for example, a processor.

For example, a module may denote a hardware and/or functional and/or structural combination of software for driving the hardware for embodying the present inventive concept. Each module may be called a device or a circuit.

Except for the monitoring module 197 and the PMU 130 of the SoC 10C of FIG. 10, the structure and the operation of the SoC 10C may be substantially identical to the structure and the operation of the SoC 10B of FIG. 9. The multi-cluster 100 includes heterogeneous clusters, for example, a first cluster 110 and a second cluster 113.

The cluster 110 or 113 assigns transaction(s) to at least one of the IPs 170-1 and/or 170-2 through the control buses 102 and 103. At least one of the IPs 170-1 and/or 170-2 may process the assigned transaction.

A host may transmit a hang occurrence signal (HOS) to the SoC 10C when at least one of the IPs 170-1 and/or 170-2 performs a series of operation to process the transactions(s) assigned through the control buses 102 and 103 and a bus hang occurs in the SoC 10B.

The debugging controller 150-1 transmits the hang occurrence signal (HOS) output from the signal distribution circuit 140 to the monitoring module 197. The debugging controller 150-1 includes a test logic 151 and a debugging logic 152.

The test logic 151 transmits the hang occurrence signal (HOS) output from the signal distribution circuit 140 to the monitoring module 197 through a first JTAG interface 153-1 when a selection signal (SEL) has a first level. The debugging logic 152 transmits the hang occurrence signal (HOS) output from the signal distribution circuit 140 to the monitoring module 197 through a second JTAG interface 153-2 when the selection signal (SEL) has a second level.

The monitoring module 197 generates a reset signal (RST) to reset the control bus 103 corresponding to at least one of the IPs 170-1 and/or 170-2 generating a bus hang in response to the hang occurrence signal (HOS) output from the first JTAG interface 153-1 or the second JTAG interface 153-2.

The monitoring module 197 transmits the generated reset signal (RST) to the control bus 103 corresponding to at least one of the IPs 170-1 and/or 170-2 generating the bus hang.

The monitoring module 197 generates an interrupt signal (INT) in response to the hang occurrence signal (HOS) and transmits the generated interrupt signal (INT) to the cluster 110 or 113 assigned at least one of the IPs 170-1 and/or 170-2 generating a bus hang for transaction.

In addition, the cluster 110 or 113 cancels the transaction in response to the interrupt signal (INT) and recognizes the information of the transaction. Thus, the cluster 110 and/or 113 might not transmit the signal (or data) related to the transaction(s) to the at least one of the IPs 170-1 and/or 170-2 which generates a bus hang.

FIG. 11 is a block diagram of an electronic system according to an exemplary embodiment of the present inventive concept. Referring to FIG. 11, an electronic system 200 may be embodied as, for example, a personal computer (PC) 300, a mobile electronic device 400, a digital camera 500, a data server, or the like.

The mobile electronic device 300 may be embodied as a laptop computer, a mobile phone, a tablet PC, a personal digital assistant (PDA), a digital video camera, a portable a multimedia player (PMP), a personal navigation device or a portable navigation device (PND), a handheld game console, a mobile internet device (MID), an e-book reader device, or the like.

The electronic system 200 includes a processor 10, a power source 210, a storage 220, a memory 230, an input/output ports 240, an expansion card 250, a network device 260, and a display 270.

The electronic system 200 further includes a camera module 280.

The processor 10 may include the SoC 10A, 10B, or 10C (collectively '10') shown in FIG. 1, 9, or 10. The processor 100 may be a multi-core processor.

The processor 10 controls the operation of at least one of the components 210 through 280. The power source 210 supplies power to at least one of the components 10 and 220 through 280. The storage device 220 may be embodied as a hard disk drive (HDD) or a solid state drive (SSD).

The memory 230 may be embodied as a non-volatile memory capable of storing a program code controlling the operation of the processor 10 or a volatile memory capable of storing data.

For example, the non-volatile memory may be a flash memory, an embedded multimedia card (eMMC), a universal flash storage (UFS), or the like. The volatile memory may be a dynamic random access memory (DRAM).

The memory controller for controlling the data access operation (e.g., read operation, write operation, program operation, or erase operation) with respect to the memory 230 may be integrated or embedded in the processor 10.

The memory controller may be embodied between the processor 10 and the memory 230.

The input/output ports may be ports for transmit data to the electronic system 200, or ports for transmitting data output from the electronic system 200 to an external device.

For example, the input/output ports 240 may be a port for connecting pointing devices such as a computer mouse or a touch pad, a port for connecting an output device such as a display 270 or a printer, a port for connecting an input device such as a keypad or a key board, or a port for connecting a USB flash drive.

The expansion card 250 may be embodied into a secure digital (SD) card, a multimedia card (MMC), or an eMMC. The expansion card 250 may be a subscriber identification module (SIM) card or a universal subscriber identity module (USIM) card.

The network device 260 may be a device for connecting the electronic system 200 to a wired network or a wireless network for communicating between the outside and the electronic system 200.

The display 270 displays data output from the storage device 220, the memory 230, the input/output ports 240, the expansion card 250, and/or the network device 260.

The camera module 280 may be a module for changing an optical image into an electrical image. Thus, the electrical image output from the camera module 280 is stored in the storage device 220, the memory 230, and/or the expansion card 250. In addition, the electrical image output from the camera module 280 is displayed through the display 220.

According to an exemplary embodiment of the present inventive concept, since the debugging controller in the SoC is not included of a power domain of each cluster, the powered-off state of the debugging controller may be maintained independently from the power state of each cluster until receiving a debugging request signal. Thus, the SoC and the method according to an exemplary embodiment of the present inventive concept may reduce power waste of the debugging controller. In addition, the SoC and the method may perform debugging on a cluster corresponding to the debugging request signal regardless the power state of each cluster.

Although the present inventive concept has been described with reference to exemplary embodiments thereof, it will be understood that the present inventive concept is not limited to the disclosed embodiments and various changes in forms and details may be made therein without departing from the spirit and scope of the present inventive concepts.

What is claimed is:

1. A system on chip (SoC), comprising:
   a debugging controller included in a first power domain and a joint test action group (JTAG) interface included in the first power domain;
   a plurality of clusters each of which is included in one or more second power domains, each of which is different from the first power domain and each of which is different from one another; and
   a power management unit (PMU) configured to release a powered-off state of the debugging controller in response to a debugging request signal output from the JTAG interface,
   wherein the PMU releases the powered-off state of a cluster corresponding to the debugging request signal among the plurality of clusters, when the cluster is in the powered-off state, and
   the debugging controller performs debugging on the cluster automatically, regardless of the power state of the plurality of clusters.

2. The SoC of claim 1, wherein the PMU is configured to continuously provide power to the JTAG interface.

3. The SoC of claim 1, wherein the debugging controller includes the JTAG interface.

4. The SoC of claim 1, wherein the PMU controls power provided to each of the plurality of clusters.

5. The SoC of claim 1, wherein the PMU releases the powered-off state of the cluster through the debugging controller.

6. An application processor comprising the SoC of claim 1.

7. The application processor of claim 6, wherein the PMU is configured to release the powered-off state of the cluster through the debugging controller.

8. A mobile electronic device comprising:
   the SoC of claim 1; and
   a memory connected to the SoC.

9. The mobile electronic device of claim 8, wherein the PMU is configured to release the powered-off state of the cluster through the debugging controller.

10. A method of operating a system on chip (SoC), comprising:
    performing powering-off, by a power management unit (PMU), on a debugging controller in a first power domain;
    receiving, by the PMU, a debugging request signal output from the a joint test action group (JTAG) interface in the first power domain;
    releasing, by the PMU, the powered-off state of the debugging controller in response to the debugging request signal;
    releasing, by the PMU, the powered-off state of a cluster corresponding to the debugging request signal among a plurality of clusters in the SoC, when the cluster is in the powered-off state; and debugging the cluster automatically, regardless of the power state of the plurality of clusters.

11. The method of claim 10, wherein the PMU continuously provides power to the JTAG interface.

12. The method of claim 10, wherein the PMU controls power provided to each of the plurality of clusters in the SoC.

13. The method of claim 10, wherein the powered-off state of the cluster is released through the debugging controller, and
the cluster is in a second power domain.

14. The method of claim 13, wherein the debugging is performed by the debugging controller.

15. A method of operating a system on chip (SoC), comprising:
receiving, by a power management unit (PMU), a debugging request signal output from a joint test action group (JTAG) interface in a first power domain, wherein the PMU continuously provides power to the JTAG interface;
releasing, by the PMU, a powered-off state of a debugging controller in the first power domain in response to the debugging request signal;
releasing, by the PMU, the powered-off state of a cluster corresponding to the debugging request signal among a plurality of clusters in the SoC, when the cluster is in the powered-off state; and
debugging the cluster automatically, regardless of the power state of the plurality of clusters.

16. The method of claim 15, further comprising:
generating, by the debugging controller, a control signal; and
transmitting, by the debugging controller, the control signal to the PMU,
wherein the powered-off state of the cluster is released in response to the control signal.

17. The method of claim 16, further comprising:
transmitting, by the PMU, a first indication signal to the debugging controller when the first-cluster is released from the powered-off state; and
debugging, by the debugging controller, the cluster in response to the first indication signal.

18. The method of claim 16, further comprising:
transmitting, by the cluster, a second indication signal to the debugging controller when the first cluster is released from the powered-off state; and
debugging, by the debugging controller, the cluster in response to the second indication signal.

19. The method of claim 15, further comprising:
generating, by the PMU, power state data of each of the plurality of clusters in the SoC; and
generating, by the debugging controller, a control signal based on the power state data,
wherein the powered-off state of the cluster is released in response to the control signal,
debugging is performed by the debugging controller, and
the power state data includes information indicating whether each of the plurality of clusters is powered-off.

* * * * *